United States Patent
Watanabe

(10) Patent No.: US 6,515,322 B1
(45) Date of Patent: *Feb. 4, 2003

(54) NONVOLATILE SEMICONDUCTOR MEMORY UTILIZING POLARIZATION OF FERROELECTRIC MATERIAL

(75) Inventor: Hirohito Watanabe, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/650,948

(22) Filed: May 20, 1996

(30) Foreign Application Priority Data

May 18, 1995  (JP) .............................. 7-142365

(51) Int. Cl.⁷ .................. H01L 29/76; H01L 29/94; H01L 31/062; H01L 31/113
(52) U.S. Cl. ............. 257/295; 257/411; 438/3
(58) Field of Search .................. 257/295, 324, 257/410, 411; 438/3, 216

(56) References Cited

U.S. PATENT DOCUMENTS

| | | | | | |
|---|---|---|---|---|---|
| 3,591,852 A | * | 7/1971 | Chen | ........................ | 257/406 |
| 4,891,684 A | * | 1/1990 | Nishioka et al. | ............. | 257/310 |
| 5,548,475 A | * | 8/1996 | Ushikubo et al. | ......... | 361/321.4 |
| 5,578,867 A | * | 11/1996 | Argos, Jr. et al. | .......... | 257/632 |
| 5,625,587 A | * | 4/1997 | Peng et al. | .................. | 365/145 |
| 5,661,319 A | * | 8/1997 | Fujii et al. | ................... | 257/295 |
| 5,666,305 A | * | 9/1997 | Mihara et al. | .............. | 365/145 |

FOREIGN PATENT DOCUMENTS

| | | |
|---|---|---|
| EP | A0540993 | 5/1993 |
| JP | A5-17139 | 1/1993 |
| JP | A51-39730 | 6/1993 |
| JP | 6151762 | * 5/1994 .................. 257/295 |
| JP | A7-78944 | 3/1995 |
| JP | A81-02528 | 4/1996 |

OTHER PUBLICATIONS

Derwent Machine–Assisted Translation of JP 07–078944–A (3/1995).*

Arnett, P., "Ferroelectric FET Device", IBM Tech. Disclosure Bulletin, vol. 15, No. 9, p. 2825, Feb., 1973.*

R. Moazzami et al., "A Ferroelectric DRAM Cell for High–Density NVRAM's", *IEEE Electron Device Letters*, vol. 11, No. 10, Oct. 1990, pp. 454–456.

"Tracé de cycles d'hystérèse par mesure d'intensités aux rayons X dans le ferroélectrique MnTO₃, (T=Y, Ho, Er, Tm, Yb, Lu).Observation directe des domanies ferroé lectriques," Bulletin de la Sociëté française Minéralogie et de Cristallographie, 1968, pp. 673–676.

* cited by examiner

*Primary Examiner*—Olik Chaudhuri
*Assistant Examiner*—Howard Weiss
(74) *Attorney, Agent, or Firm*—Sughrue Mion, PLLC

(57) ABSTRACT

A nonvolatile semiconductor memory comprises a silicon substrate, a gate electrode formed through a gate insulator film on a principal surface of the semiconductor substrate, a pair of source/drain regions formed in a principal surface region of the semiconductor substrate to locate the gate electrode between the pair of source/drain regions. The gate insulator film is formed of a silicon oxide and/or silicon nitride film in contact with the principal surface of the semiconductor substrate, and a lead germanate film which is formed on the silicon oxide and/or silicon nitride film and which is a ferroelectric having a dielectric constant of not larger than 50.

4 Claims, 10 Drawing Sheets

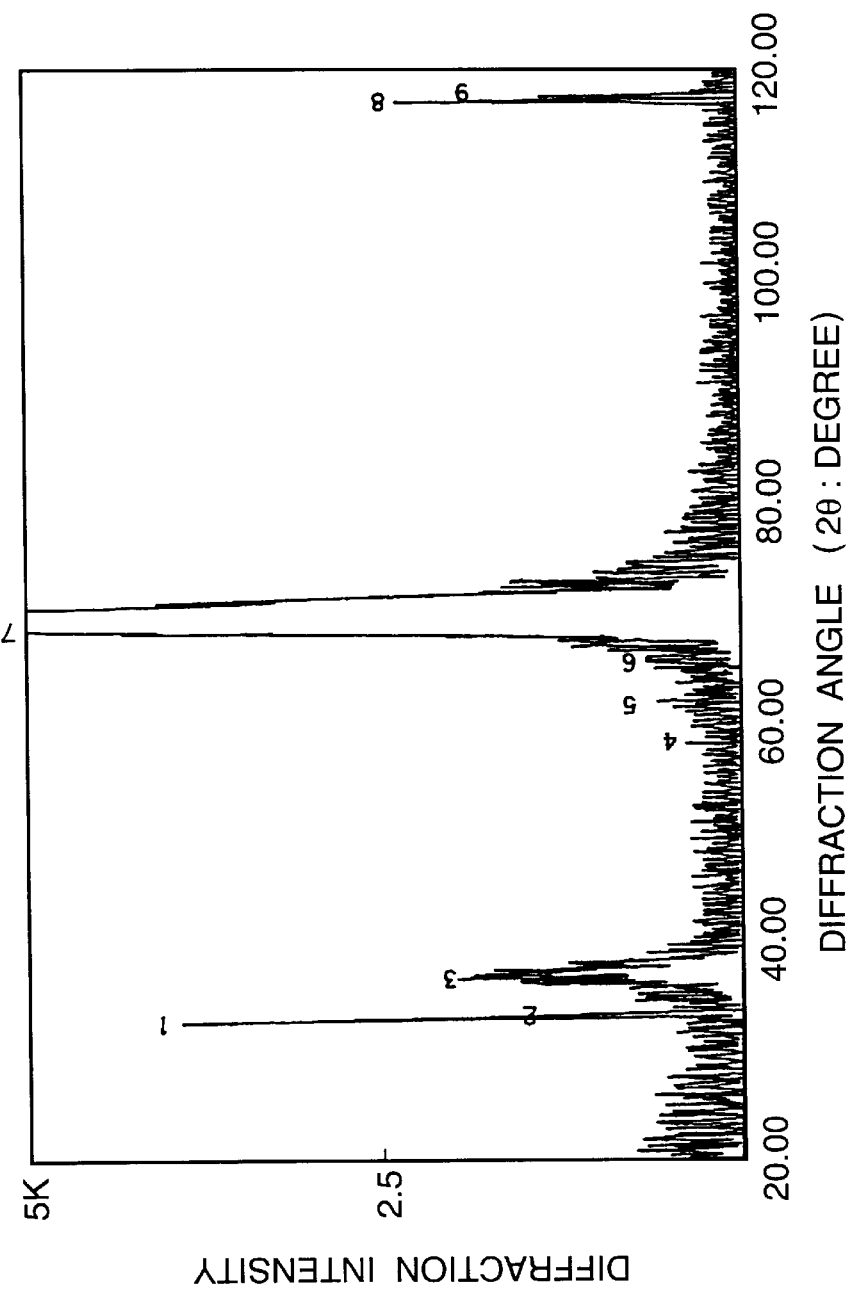

NONVOLATILE SEMICONDUCTOR MEMORY UTILIZING POLARIZATION OF FERROELECTRIC MATERIAL

BACKGROUND OF THE INVENTION

1. Field of the invention

The present invention relates to a nonvolatile semiconductor memory, and more specifically to a nonvolatile semiconductor memory configured to store information by utilizing polarization of a ferroelectric material.

2. Description of Related Art

A nonvolatile semiconductor memory utilizing a ferroelectric material as a medium for storing information, has an advantage that if deterioration of a ferroelectric material film does not occur, information can be stored for a long term of time, and further, is expected that it can make it possible to reduce a memory cell size and therefore to realize a memory having a large storage capacity.

Reza Moazzami et al, "A Ferroelectric DRAM Cell for High-Density NVRAM's", IEEE ELECTRON DEVICE LETTERS, Vol. 11, No.10, October 1990, Pages 454–456, (the disclosure of which is incorporated by reference in its entirety into this application) proposed one example of the above mentioned conventional nonvolatile semiconductor memory, in which a capacitor dielectric of a DRAM memory cell capacitor is formed of lead zirconate titanate ($PbZr_{1-x}Ti_xO_3$)

Referring to FIG. 1, there is shown a diagrammatic sectional view of the nonvolatile semiconductor memory proposed by Reza Moazzami et al. On a principal surface of a P-type silicon substrate 101, a device isolation oxide film (field oxide) 102 is formed by a selective oxidation such as a LOCOS (local oxidation of silicon) process, and within an active region confined by the device isolation oxide film, a gate electrode 103 is formed through a gate insulator film on the surface of the substrate. A source region 104 and a drain region 105 are formed in a surface region of the substrate at opposite sides of the gate electrode 103, so as to locate the gate electrode between the source region and the drain region. A first interlayer insulator film 106 is formed to cover a whole surface of the substrate, and a Pt film 107 is formed on the first interlayer insulator film 106, above a position of the gate electrode 103. Furthermore, a PZT ($PbZr_{1-x}Ti_xO_3$) film 108 is formed to cover the Pt film 107. A second interlayer insulator film 109 is formed to cover a whole surface of the substrate including the PZT film 108. In addition, contact holes are formed to reach the drain region 105 and the PZT film 108, respectively, and an aluminum wiring conductor 110 is formed on the second interlayer insulator film 109 to contact with the drain region 105 and the PZT film 108 through the contact holes.

Referring to FIG. 2, there is shown a diagrammatic section view illustrating another example of a conventional nonvolatile semiconductor memory utilizing a ferroelectric material film, in which a gate insulator film of a transistor is formed of a ferroelectric material film.

As shown in FIG. 2, a device isolation oxide film 2 is formed on a principal surface of a P-type silicon substrate 1, and a ferroelectric material film 4C is formed on the principal surface of the substrate 1 to constitute a gate insulator film. A gate electrode 5A is formed on the ferroelectric material film 4C, and a source region 7 and a drain region 8 are formed in a surface region of the substrate at opposite sides of the gate electrode 5A, so as to locate the gate electrode between the source region and the drain region.

This structure is very effective in reducing the cell size, since the transistor itself has a memory part. The ferroelectric material of the gate insulator film, which is now under consideration, is $BaMgF_4$ and $PbZr_{1-x}Ti_xO_3$.

A construction and an operation principle of this type memory cell is discussed in, for example, "Nonvolatile Memory FET Utilizing A Ferroelectric Material Thin Film", Report of (Japanese) Society of Electronic Communication, CPM-78-46: 1, 1978, the disclosure of which is incorporated by reference in its entirety into this application.

In the conventional memory cell shown in FIG. 1, since the electrode underlying the ferroelectric material film has to be formed of a material such as Pt, which is hard to etch or pattern, a fine patterning is difficult. In addition, since each memory cell consists of a transistor part and a memory part, the structure is complicated. This is inconvenient to micro-miniaturization.

On the other hand, in the second conventional example shown in FIG. 2, since a material, such as $PbZr_{1-x}Ti_xO_3$, having a high dielectric constant, is used as the ferroelectric material, it is difficult to form a highly reliable device. In addition, it is difficult to realize a low voltage driving, which is recently strongly demanded by users. The reason for these disadvantages will be described in the following.

In the case that a $PbZr_{1-x}Ti_xO_3$ film is used as the gate insulating film, when the $PbZr_{1-x}Ti_xO_3$ film is deposited directly on a silicon substrate, a natural oxide (or native oxide) layer having a thickness of about 2 nm is inevitably formed at a boundary of the silicon substrate.

A coercive electric field (applied electric field when polarization reversal starts) of the $PbZr_{1-x}Ti_xO_3$ film is on the order of 80 kV/cm, and a dielectric constant of the $PbZr_{1-x}Ti_xO_3$ film is on the order of 1000. On the other hand, a dielectric constant of a silicon oxide film is on the order of 4. Therefore, when the coercive electric field is applied across the $PbZr_{1-x}Ti_xO_3$ film, an electric field as high as 20 MV/cm {=80 kV/cm×(1000/4)} is applied across the natural oxide film. However, since the natural oxide film is not an intentionally formed film, the natural oxide film is not so good in film quality, so that there is high possibility that if a high electric field as mentioned above is applied, the natural oxide film is broken down.

Here, assuming that the $PbZr_{1-x}Ti_xO_3$ film is formed to have a thickness of 100 nm, it is necessary to apply a voltage of 0.8 V across the $PbZr_{1-x}Ti_xO_3$ film in order to apply a necessary coercive electric field. Incidentally, in order to cause a complete polarization reversal, it is necessary to apply a voltage which is higher than 0.8 V by several ten percents. At this time, on the other hand, a voltage of 4 V (=20 MV/cm×2 nm) is applied across the natural oxide film. Therefore, it is necessary to apply a voltage of 5 V or more to the gate electrode in order to cause the polarization reversal. This means that it is difficult to operate an actual device with a low voltage.

On the other hand, if the gate insulator film is formed of $BaMgF_4$, no natural oxide film is formed since $BaMgF_4$ does not include an oxidizing specie. However, polarizability of this material is relatively low. In addition, if the $BaMgF_4$ film contains a crystal defect, the polarizability further lowers. Therefore, in order to constitute a satisfactory memory, it is necessary to form a $BaMgF_4$ film having an excellent film quality, namely, less crystal defect. However, this is not so easy because of difference in lattice constant between $BaMgF_4$ and a silicon substrate and because of other causes.

Since there exist ferroelectric materials other than oxides having a low dielectric constant, it is possible to prevent formation of the natural oxide by using the ferroelectric materials other than oxides. However, these ferroelectric materials are small in polarizability and poor in heat resistive property, and therefore, it is difficult to use these ferroelectric materials as a material used for manufacturing a semiconductor device.

SUMMARY OF THE INVENTION

Accordingly, it is an object of the present invention to provide a nonvolatile semiconductor memory which has overcome the above mentioned defects of the conventional ones.

Another object of the present invention is to provide a nonvolatile semiconductor memory configured to store information by utilizing polarization of a ferroelectric material, the nonvolatile semiconductor memory having a simple construction and a high reliability and being easy to manufacture and to microminiaturize, the nonvolatile semiconductor memory being able to be driven with a low voltage.

The above and other objects of the present invention are achieved in accordance with the present invention by a nonvolatile semiconductor memory comprising a semiconductor substrate, a gate electrode formed through a gate insulator film on a principal surface of the semiconductor substrate, a pair of source/drain regions formed in a principal surface region of the semiconductor substrate to locate the gate electrode between the pair of source/drain regions, the gate insulator film being formed of a first insulating film in contact with the principal surface of the semiconductor substrate, and a second insulating film formed on the first insulating film, the second insulating film being formed of a ferroelectric oxide having a dielectric constant of not larger than 50.

In an embodiment of the nonvolatile semiconductor memory, the second insulating film includes a material selected from a group consisting of $Pb_5Ge_3O_{11}$, $LiTaO_3$, $YMnO_3$, $YbMnO_3$, $ErMnO_3$ and $HoMnO_3$. The first insulating film is formed of a film selected from the group consisting of a silicon oxide film, a silicon oxynitride film and a laminated layer composed of an underlying silicon oxide film and an overlying silicon nitride film. Furthermore, a silicon oxide film or a silicon nitride film is preferably formed between the second insulating film and the gate electrode.

The inventor of the present invention discovered that if an electric field of not greater than 2 MV/cm is applied across the natural oxide film, deterioration of a semiconductor device is not facilitated. For example, if a layer of a ferroelectric material having a coercive electric field of 80 kV/cm and a dielectric constant of 50 and a natural (silicon) oxide film are stacked on each other, when the coercive electric field is applied across ferroelectric material layer, an electric field of 1 MV/cm {=80 kV/cm×(50/4)} is applied across the natural (silicon) oxide film. As mentioned hereinbefore, in order to completely polarize the ferroelectric material, it is necessary to apply an electric field larger than the coercive electric field. Therefore, even if it is assumed that polarization is caused by an electric field which is a double of the coercive electric field, the natural silicon oxide film is in no way deteriorated by this electric field.

On the other hand, in order to eliminate a defect at the time of a device manufacturing so as to realize a device operation having a high reliability, the ferroelectric material film provided as the gate insulator film is required to have a film thickness on the order of 50 nm to 200 nm. Assuming that the ferroelectric material film has the coercive electric field of 80 kV/cm, it is necessary to apply a voltage of 0.4 V to 1.6 V across the ferroelectric material film. Under this condition, on the other hand, a voltage of 0.2 V is applied across the natural oxide film. Accordingly, it is possible to start polarization by applying a voltage of 0.6 V to 1.8 V to the gate electrode. Thus, even considering that it is necessary to apply a voltage higher than that voltage by several ten percents in order to cause a complete polarization, it is possible to drive the memory with an extremely low voltage.

Furthermore, most of oxide ferroelectric materials are not deteriorated even if a semiconductor device manufacturing temperature is applied.

The above and other objects, features and advantages of the present invention will be apparent from the following description of preferred embodiments of the invention with reference to the accompanying drawings.

BRIEF DESCRIPTION OF THE DRAWINGS

FIG. 5 is a graph illustrating the result of an X-ray diffraction measurement of the lead germanate film in the first embodiment of the nonvolatile semiconductor memory;

DESCRIPTION OF THE PREFERRED EMBODIMENTS

Referring to FIGS. 3A to 3E, there are shown diagrammatic sectional views illustrating a process for manufacturing a first embodiment of the nonvolatile semiconductor memory in accordance with the present invention utilizing polarization of a ferroelectric material.

Figure 1:
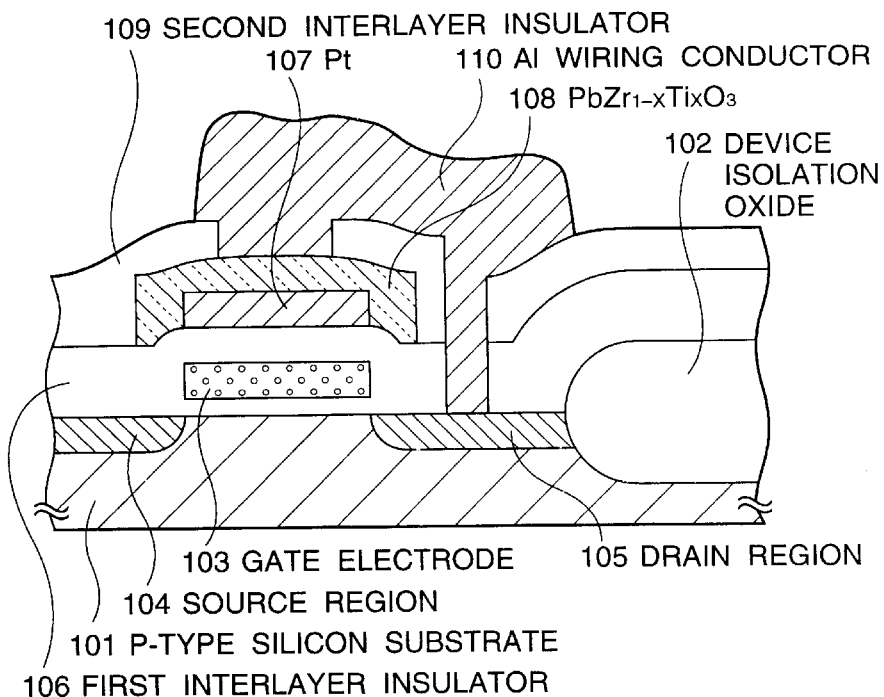
FIG. 1 is a diagrammatic sectional view of a first example of the conventional nonvolatile semiconductor memory utilizing polarization of a ferroelectric material.
Figure 2:
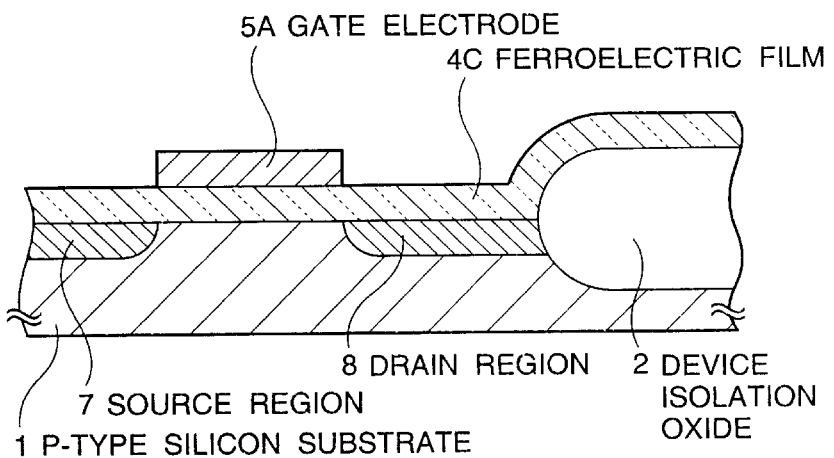
FIG. 2 is a diagrammatic sectional view of a second example of the conventional nonvolatile semiconductor memory utilizing polarization of a ferroelectric material.
Figure 3A:
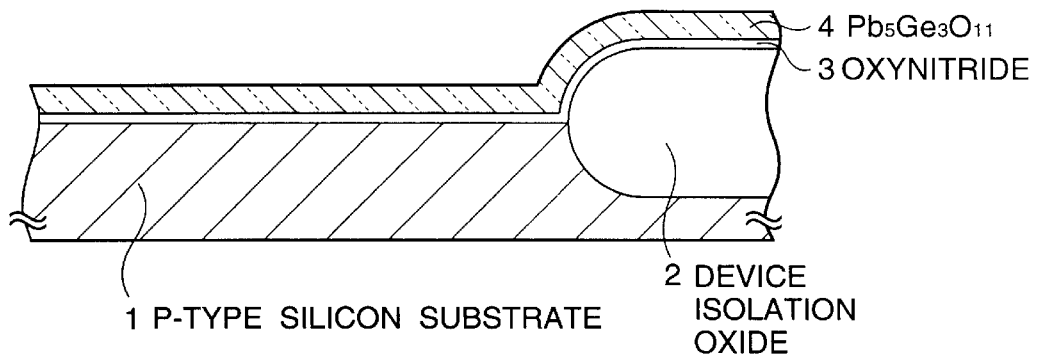
FIGS. 3A to 3E are diagrammatic sectional views illustrating a process for manufacturing a first embodiment of the nonvolatile semiconductor memory in accordance with the present invention utilizing polarization of a ferroelectric material.

First, as shown in FIG. 3A, on a principal surface of a P-type silicon substrate 1, a device isolation oxide film (field oxide) 2 is formed by a selective oxidation such as a LOCOS (local oxidation of silicon) process. Then, a thermal oxidation is carried out in a low pressure atmosphere (for example, 1 Torr) at a temperature of 800° C., so as to form a thin oxide film having a thickness of 1.5 nm on the principal surface of the substrate 1. Furthermore, the thermal oxide film is lamp-heated within a $NH_3$ atmosphere so that an oxynitride film 3 is formed on the surface of the substrate.

Thereafter, an ethylate (or ethoxide) of lead and an ethylate of germanium are prepared, and then, mixed to have a composition ratio of 5:3. The obtained mixture is deposited on the oxynitride film 3 by a sol gel process. Furthermore, an annealing is carried out within a dry oxygen atmosphere at 650° C. for one hour. With this treatment, a film 4 of $Pb_5Ge_3O_{11}$ (lead germanate film) having a thickness of 100 nm is formed on the oxynitride film 3 as shown in FIG. 3A.

Figure 3B:
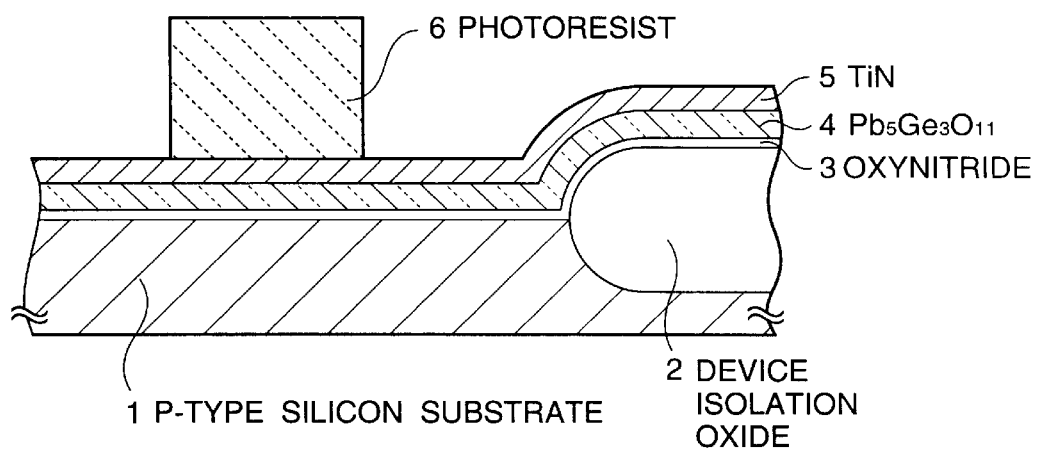

Thereafter, a TiN film 5 having a thickness of 100 nm, which is used for forming a gate electrode, is deposited on the lead germanate film film 4 by a sputtering at a room temperature. Then, a photoresist film is deposited, and exposure and development are carried out to form a patterned photoresist film 6 having a pattern for the gate electrode, as shown in FIG. 3B.

Figure 3C:
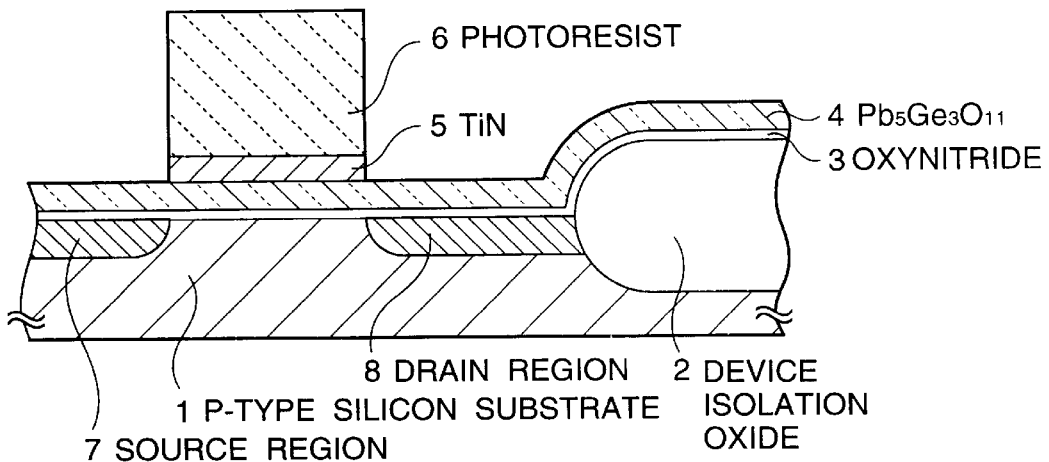

By using the patterned photoresist film 6 as a mask, a dry etching using a chlorine containing gas is performed to pattern the TiN film 5 so as to form a gate electrode. Furthermore, by using the patterned photoresist film 6 and the device isolation oxide film 2 as a mask, arsenic (As) is ion-implanted to form a source region 7 and a drain region 8 in a surface region of the substrate 1, as shown in FIG. 3C.

Figure 3D:
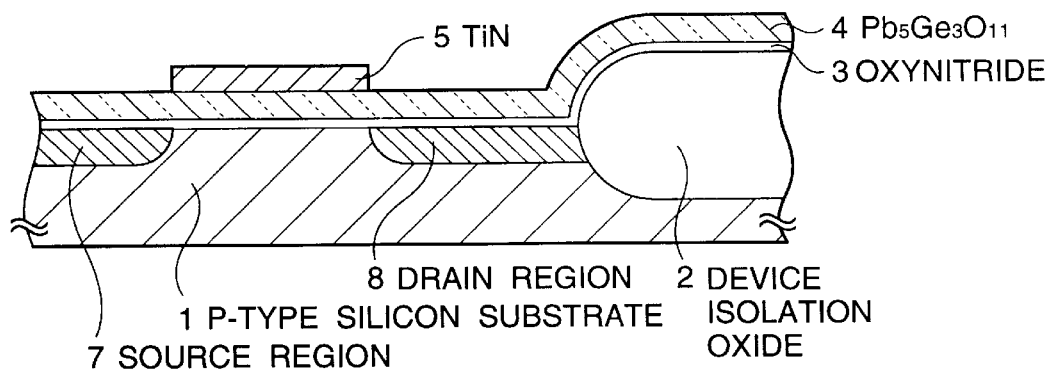
Figure 3E:
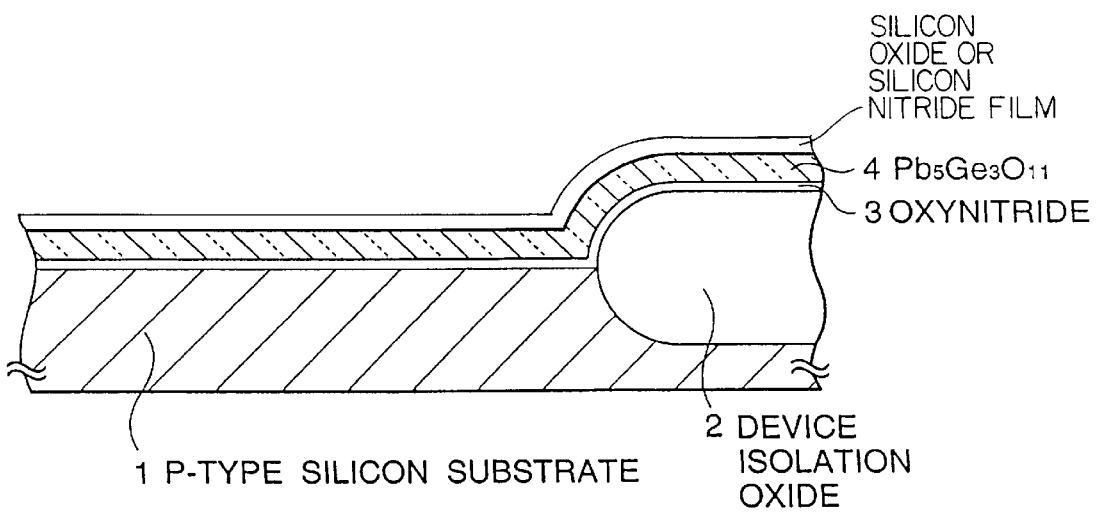

Then, the photoresist film 6 is ashed in an oxygen plasma so that the photoresist film 6 is removed as shown in FIG. 3D.

In the above mentioned first embodiment, the gate electrode (TiN film 5) is formed on the $Pb_5Ge_3O_{11}$ film 4 at the room temperature. However, in the case that a heat treatment is performed after formation of an upper electrode, and in the case that the gate electrode itself is formed at a high temperature process, it is preferred to form a silicon oxide film or a silicon nitride film, at a boundary between the $Pb_5Ge_3O_{11}$ film 4 and the gate electrode, namely, on the $Pb_5Ge_3O_{11}$ film 4 before deposition of the gate electrode layer (see, FIG. 3E), in order to prevent reaction between the $Pb_5Ge_3O_{11}$ film 4 and the gate electrode metal.

Figure 4A:
FIGS. 4A and 4B are scanning electron microscope photographs of a surface and a section of a lead germanate film in the first embodiment of the nonvolatile semiconductor memory.
Figure 4B:
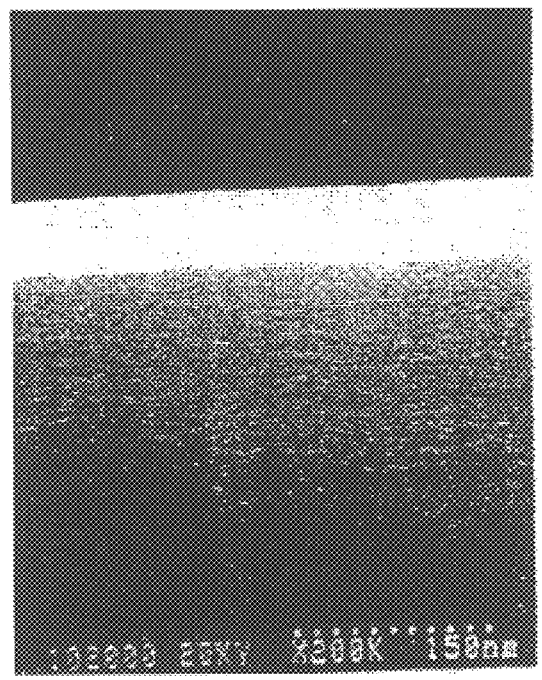

In order to investigate a characteristics and a structure of the lead germanate film formed in the first embodiment, a lead germanate film was formed on a whole surface of a silicon substrate by a sol gel process. Scanning electron microscope photographs of a surface and a section of the lead germanate film thus formed are shown in FIGS. 4A and 4B. From these photographs, it would be seen that a film having a smooth surface and a thickness on the order of 900 Å is formed on the silicon substrate. Furthermore, the result of an X-ray diffraction measurement of the lead germanate film thus formed is shown in FIG. 5. It would also be seen that the lead germanate film thus formed is polycrystalline.

Furthermore, a TiN film (used for constituting the gate electrode) was formed on the lead germanate film thus formed, and a dielectric constant and a hysteresis characteristics were measured. The result of the measurement is that the dielectric constant is about 18.3 and the residual dielectric polarization is about 1.2 $\mu C/cm^2$.

In addition, in order to analyze in detail the lead germanate film formed in the first embodiment, a lead germanate film having a thickness of 3000 Å was formed on a Pt electrode by the above mentioned sol gel process. This lead germanate film having the thickness of 3000 Å had the coercive electric field of 14 kV/cm and the residual dielectric polarization of about 1.6 $\mu C/cm^2$. Therefore, it would be understood that polarization reversal occurs by applying a voltage on the order of 0.4 V to the lead germanate film.

In the device structure of the first embodiment, under the ferroelectric material film, there is formed the oxynitride film having the thickness of 2 nm converted into an oxide film thickness. Therefore, in the case of polarizing the lead germanate film having the thickness of 100 nm used in the actual device, a voltage applied across the natural oxide film is on the order of 0.013 V. This means that the natural oxide film is applied with only a voltage of 1/300 of the voltage applied in the case of the PZT film. This is considered to be attributable to the fact that both the dielectric constant and the coercive electric field of the ferroelectric material became small.

Incidentally, an electric charge required to actually operate the device as a memory, is on the order of 0.5 $\mu C/cm^2$. Therefore, the residual dielectric polarization of about 1.6 $\mu C/cm^2$, which could have been confirmed at present, is a satisfactory value.

Referring to FIGS. 6A to 6D, there are shown diagrammatic sectional views illustrating a process for manufacturing a second embodiment of the nonvolatile semiconductor memory in accordance with the present invention utilizing polarization of a ferroelectric material.

First, on a principal surface of a P-type silicon substrate 1, a device isolation oxide film 2 is formed by a selective oxidation process. Then, the substrate 1 is heated to a temperature of 800° C., and then, is exposed to an oxygen gas diluted by a nitrogen gas, so that a silicon oxide film 3A having a thickness of 1.5 nm is formed on the surface of the substrate 1. Furthermore, a silicon nitride film 3B having a thickness of about 2 nm is formed on the silicon oxide film 3A by a low pressure CVD process.

Thereafter, by a sputtering using a target composed of a lead oxide and a germanium oxide, an oxide of Pb and Ge is deposited to form a film having a thickness of about 200 nm. The molar ratio of Pb and Ge in the target is 2.5:1. Namely, Pb is richer than Ge. The sputtering condition is that the substrate temperature is 450° C., and the plasma is generated in an atmosphere consisting of 90% of Ar and 10% of oxygen under a pressure of 6 mTorr. The film thus formed has a composition ratio of Pb:Ge=2:1. The reason for why the proportion of Pb drops as compared with the molar ratio in the target, is considered to be that lead evaporated at the temperature of 450° C.

An oxidizing treatment is performed on this film within an oxygen atmosphere at a temperature of 650° C. for three minutes. The composition ratio of Pb and Ge of the film after this oxidizing treatment was Pb:Ge=1.7:1, which approached the composition of $Pb_5Ge_3O_{11}$. From the X-ray diffraction analysis of this film, it was known that about 80% of the $Pb_5Ge_3O_{11}$ film thus formed is a c-axis-oriented film. This film is called a $Pb_5Ge_3O_{11}$ film 4 in FIG. 6A for convenience.

Figure 6A:
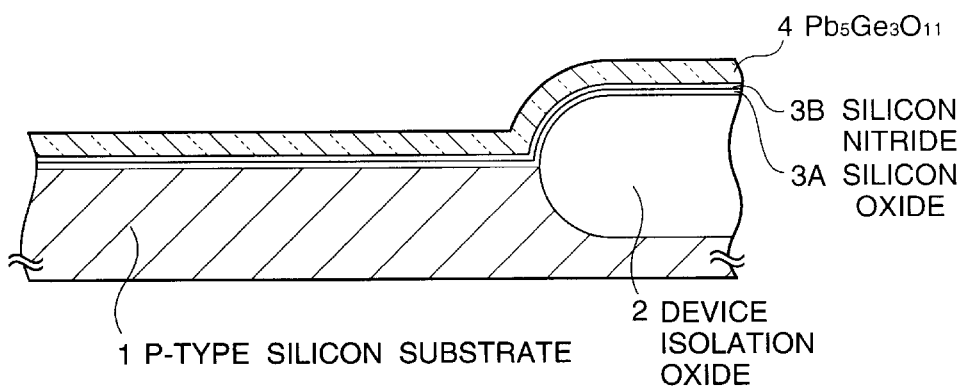
FIGS. 6A to 6D are diagrammatic sectional views illustrating a process for manufacturing a second embodiment of the nonvolatile semiconductor memory in accordance with the present invention utilizing polarization of a ferroelectric material.
Figure 6B:
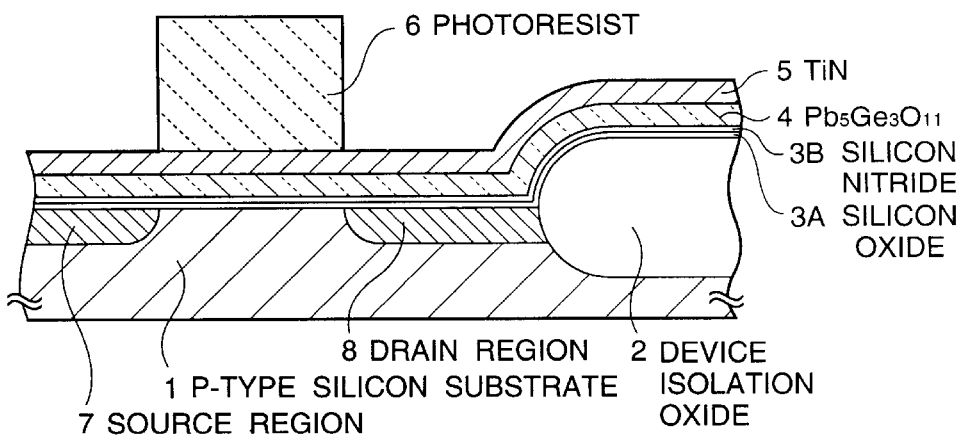

Thereafter, a TiN film 5 having a thickness of 100 nm is deposited on the $Pb_5Ge_3O_{11}$ film 4 by a sputtering. Then, a photoresist film is deposited, and exposure and development are carried out to form a patterned photoresist film 6 having a pattern for the gate electrode. By using the patterned photoresist film 6 and the device isolation oxide film 2 as a mask, arsenic (As) is ion-implanted to form a source region 7 and a drain region 8 in a surface region of the substrate 1, as shown in FIG. 6B.

Figure 6C:
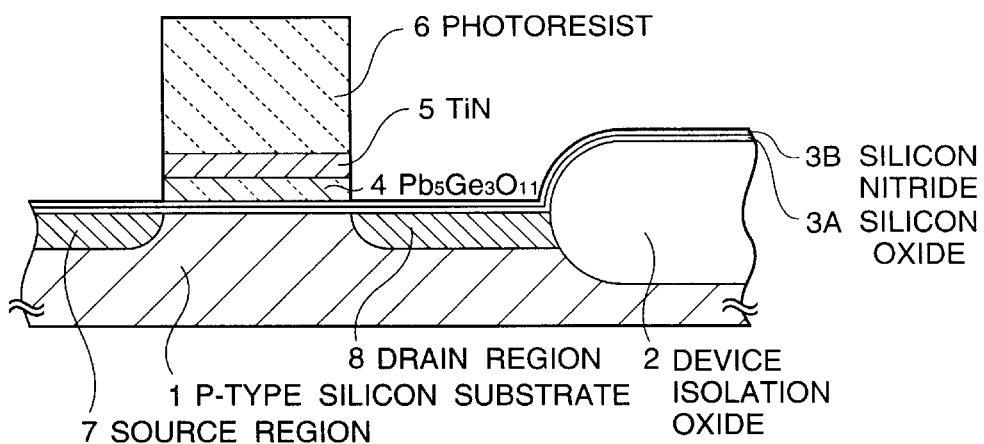

By using the patterned photoresist film 6 as a mask, a dry etching is performed to remove the TiN film 5 and the $Pb_5Ge_3O_{11}$ film 4 which are not covered with the patterned photoresist film 6, so that a gate electrode is formed as shown in FIG. 6C.

Figure 6D:
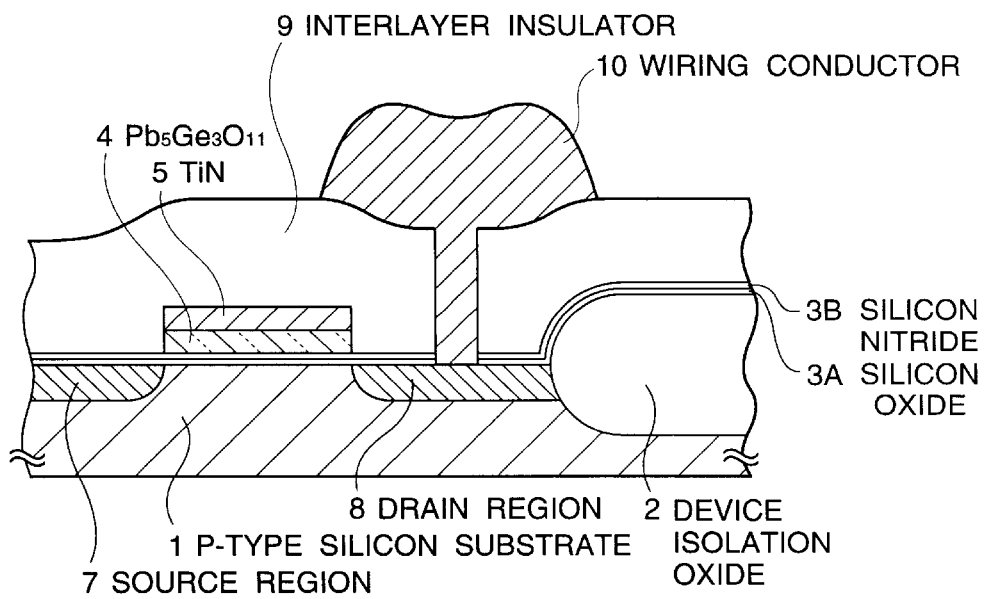

After the photoresist film 6 is ashed and removed in an oxygen plasma, a silicon oxide film having a thickness of 200 nm is deposited by a CVD process with a substrate temperature of 400° C., so as to form an interlayer insulator film 9 which completely covers the whole surface. Then, a contact hole is formed to reach the drain region 8, and an aluminum alloy film is deposited and patterned to form a wiring conductor 10 contacting to the drain region 8 through the contact hole, as shown in FIG. 6D. This wiring conductor 10 constitutes a bit line. Incidentally, the source region 7 is connected in common to a source region of other memory cells by means of a diffused layer (not shown) formed in the substrate.

In the above, the methods for manufacturing the memory cell in the nonvolatile semiconductor memory have been described. However, in order to operate the memory, it is necessary to form a peripheral circuit. This peripheral circuit can be formed in the same process as that for manufacturing a peripheral circuit in a conventional memory. In the present invention, however, it is preferred to previously form the peripheral circuit, prior to formation of the memory cells. But, if the peripheral circuit can be formed in a process of not higher than 700° C., the peripheral circuit can be formed after the formation of the memory cells. In the embodiments, the source region is connected in common to the source region of other memory cells by means of the diffused layer formed in the substrate, but can be connected through a wiring conductor.

In the memory as mentioned above, the transistor is on-off controlled by direction of the polarization of the $Pb_5Ge_3O_{11}$ film 4. Therefore, the memory as mentioned above can be operated as a nonvolatile memory.

Referring to FIGS. 7A to 7D, there are shown diagrammatic sectional views illustrating a process for manufacturing a third embodiment of the nonvolatile semiconductor memory in accordance with the present invention utilizing polarization of a ferroelectric material.

First, on a principal surface of a P-type silicon substrate 1, a device isolation oxide film 2 is formed by a selective oxidation process. Then, the substrate 1 is heated to a temperature of 800° C., and then, is exposed to an oxygen gas diluted by a nitrogen gas, so that a silicon oxide film 3A having a thickness of 1.5 nm is formed on the surface of the substrate 1. Furthermore, a silicon nitride film 3B having a thickness of about 3 nm is formed on the silicon oxide film 3A by a low pressure CVD process.

Figure 7A:
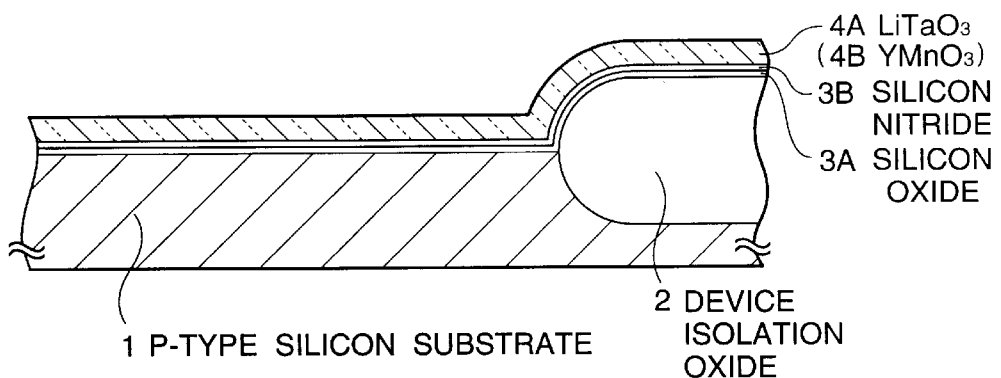
FIGS. 7A to 7D are diagrammatic sectional views illustrating a process for manufacturing third and fourth embodiments of the nonvolatile semiconductor memory in accordance with the present invention utilizing polarization of a ferroelectric material.

Thereafter, by a sputtering using a target which is formed by compacting a $LiTaO_3$ powder, an oxide of Li and Ta is deposited to form a film having a thickness of about 200 nm. The sputtering condition is that the substrate temperature is 560° C., and the plasma is generated in an atmosphere consisting of 90% of Ar and 10% of oxygen under a pressure of 6 mTorr. In the film thus formed, a molar ratio of Li:Ta is about 1:1. Then, an oxidizing treatment is performed on this film within an oxygen atmosphere at a temperature of 1100° C. for thirty seconds. From the X-ray diffraction analysis of this film, it was confirmed that the film thus formed is a $LiTaO_3$ film 4A (FIG. 7A).

Figure 7B:
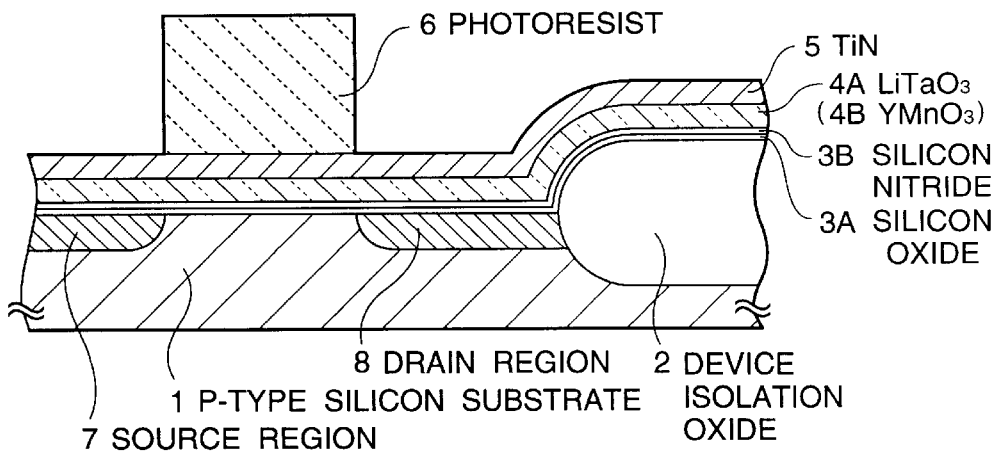

Thereafter, a TiN film 5 having a thickness of 100 nm is deposited on the $LiTaO_3$ film 4A thus formed, by sputtering at a room temperature. Then, a photoresist film is deposited, and exposure and development are carried out to form a patterned photoresist film 6 having a pattern for the gate electrode. By using the patterned photoresist film 6 and the device isolation oxide film 2 as a mask, arsenic (As) is ion-implanted to form a source region 7 and a drain region 8 in a surface region of the substrate 1, as shown in FIG. 7B.

Figure 7C:
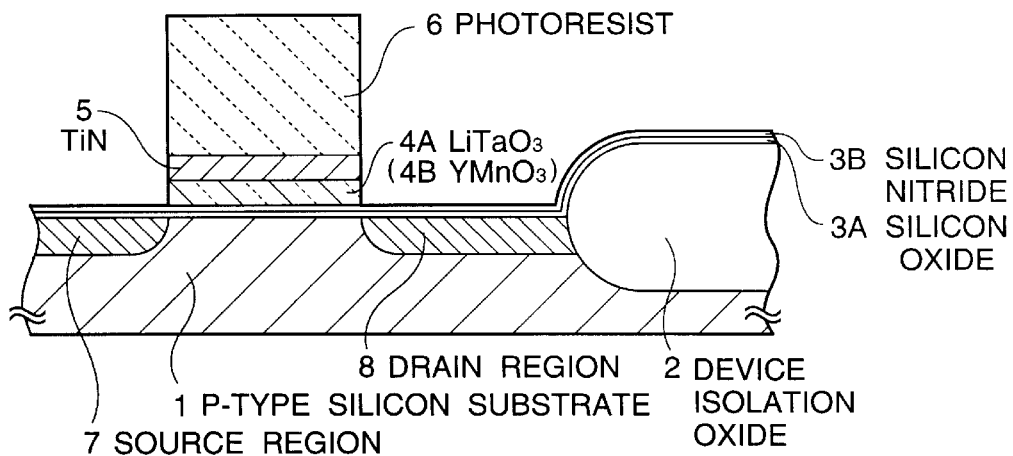

By using the patterned photoresist film 6 as a mask, a dry etching is performed to remove the TiN film 5 and the $LiTaO_3$ film 4A which are not covered with the patterned photoresist film 6, so that a gate electrode is formed as shown in FIG. 7C.

Figure 7D:
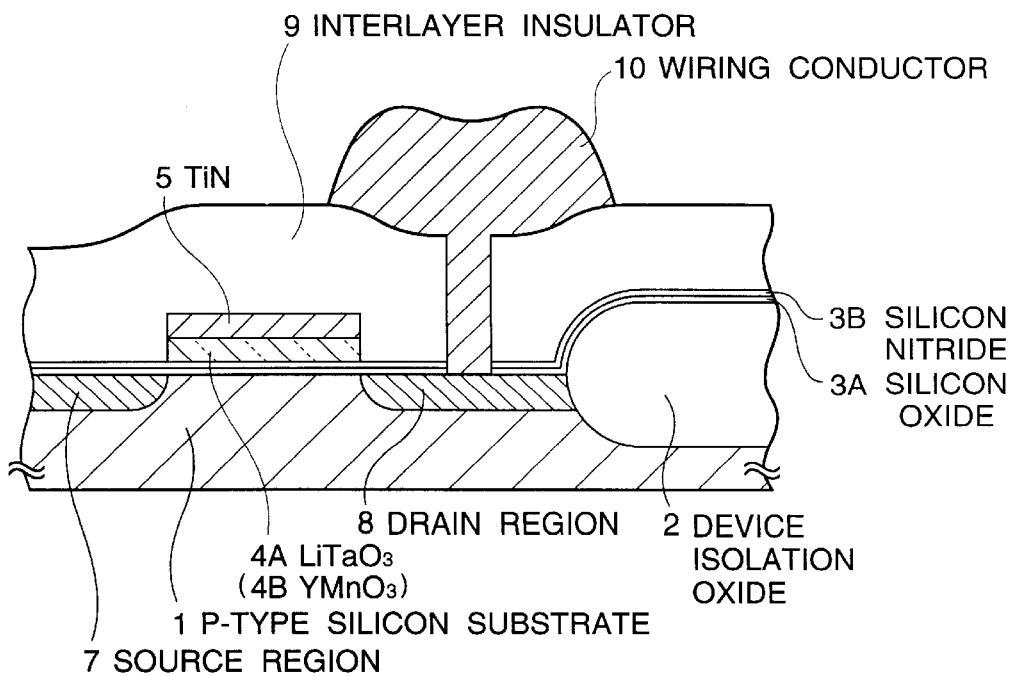

After the photoresist film 6 is ashed and removed in an oxygen plasma, a silicon oxide film having a thickness of 200 nm is deposited by a CVD process with a substrate temperature of 400° C., so as to form an interlayer insulator film 9 which completely covers the whole surface. Then, a contact hole is formed to reach the drain region 8, and an aluminum alloy film is deposited and patterned to form a wiring conductor 10 contacting to the drain region 8 through the contact hole, as shown in FIG. 7D. This wiring conductor 10 constitutes a bit line. Incidentally, the source region 7 is connected in common to source regions of other memory cells by means of a diffused layer (not shown) formed in the substrate, similarly to the other embodiments.

In the above, the method for manufacturing the third embodiment of the memory cell in the nonvolatile semiconductor memory has been described. In this embodiment, it is preferred to previously form a peripheral circuit for operating the memory, prior to formation of the memory cells. The reason for this is that since Li is easy to diffuse, contamination of the device must be made as small as possible. The silicon nitride film formed under the $LiTaO_3$ film is a film required as a barrier for preventing diffusion of Li. In addition, the silicon oxide film is provided as a lowermost layer, for the purpose of reducing energy levels at a boundary so as to elevate performance of the transistor.

The dielectric constant of the $LiTaO_3$ film 4A thus formed was about 45. It was confirmed that the transistor can be on-off controlled by direction of the polarization of the $LiTaO_3$ film 4A, and therefore, this memory as mentioned above can be operated as a nonvolatile memory.

Then, a fourth embodiment of the nonvolatile semiconductor memory in accordance with the present invention utilizing polarization of a ferroelectric material, will be described with reference to FIGS. 7A to 7D, again.

The fourth embodiment is characterized in that a $YMnO_3$ film 4B is formed in place of the $LiTaO_3$ film 4A in the third embodiment. Since the process other than a step of forming the $YMnO_3$ film 4B is the same as a corresponding process of the third embodiment, only the step of forming the $YMnO_3$ film 4B will be described in the following.

By a sputtering using a target which is formed by compacting a $YMnO_3$ powder, an oxide of Y and Mn is deposited on the silicon nitride film 3B to form a film having a thickness of about 150 nm. The sputtering condition is that the substrate temperature is 600° C., and the plasma is generated in an atmosphere consisting of 90% of Ar and 10% of oxygen under a pressure of 10 mTorr. In the film thus formed, a molar ratio of Y:Mn is about 1:1. Then, an oxidizing treatment is performed on this film within an oxygen atmosphere at a temperature of 800° C. for sixty seconds. From the X-ray diffraction analysis of this film, it was confirmed that the film thus formed is a $YMnO_3$ film (FIG. 7A).

In place of the $YMnO_3$ film 4B in the fourth embodiment, it is possible to form a film of $ErMnO_3$, $YbMnO_3$ or $HoMnO_3$ which has a crystal structure similar to that of the $YMnO_3$ film.

As seen from the above, the nonvolatile semiconductor memory in accordance with the present invention is characterized in that a gate insulator film of a MOS transistor is formed of a ferroelectric material having a dielectric constant of not larger than 50. With this feature, it is possible to ensure that an excessive electric field is in no way applied across the other gate insulator film portion which is formed of a natural silicon oxide. Therefore, deterioration of the insulating film can be prevented, and a highly reliable nonvolatile semiconductor memory can be provided. In addition, since it is possible to make small the voltage applied to the gate insulator film portion other than the ferroelectric material film, it is possible to drive the memory at a low voltage.

The invention has thus been shown and described with reference to the specific embodiments. However, it should be noted that the present invention is in no way limited to the details of the illustrated structures but changes and modifications may be made within the scope of the appended claims.

What is claimed is:

1. A nonvolatile ferroelectric semiconductor memory comprising:

a semiconductor substrate;

a gate electrode formed on a gate insulator film on a principal surface of the semiconductor substrate;

a pair of source/drain regions formed in a principal surface region of the semiconductor substrate so as to locate the gate electrode between the pair of source/drain regions; and the gate insulator film including a first insulating film in contact with the principal surface of the semiconductor substrate, and a second insulating film in contact with the first insulating film, the second insulating film being formed of a ferroelectric oxide having a dielectric constant of not larger than 50, wherein the second insulating film has a thickness which is substantially greater than the thickness of the first insulating film, and wherein the ferroelectric semiconductor memory positively utilizes an inversion of a spontaneous polarization of the ferroelectric oxide for storage, wherein the first insulating film is formed of a film selected from the group consisting of a silicon oxynitride film and a laminated layer composed of an underlying silicon oxide film in contact with the principal surface of the semiconductor substrate and an overlying silicon nitride film in contact with the second insulating film formed of the ferroelectric oxide.

2. A nonvolatile semiconductor memory as claimed in claim 1, wherein the second insulating film includes a material selected from a group consisting of $Pb_5Ge_3O_{11}$, $LiTaO_3$, $YMnO_3$, $YbMnO_3$, $ErMnO_3$ and $HoMnO_3$.

3. A nonvolatile semiconductor memory as claimed in claim 1, wherein a silicon oxide film or a silicon nitride film is formed between the second insulating film and the gate electrode.

4. A nonvolatile semiconductor memory comprising:

a semiconductor substrate;

a gate electrode formed on a gate insulator film on a principal surface of the semiconductor substrate;

a pair of source/drain regions formed in a principal surface region of the semiconductor substrate so as to locate the gate electrode between the pair of source/drain regions; and the gate insulator film including a first insulating film in contact with the principal surface of the semiconductor substrate, and a second insulating film in contact with the first insulating film, the second insulating film being formed of a ferroelectric oxide having a dielectric constant of not larger than 50, wherein the second insulating film has a thickness which is substantially greater than the thickness of the first insulating film, and wherein the ferroelectric semiconductor memory positively utilizes an inversion of a spontaneous polarization of the ferroelectric oxide for storage, wherein the thickness of the second insulating film is between 50 nm and 200 nm and the thickness of the first insulating film is less than 3 nm.

* * * * *